Aug. 16, 1966 G. G. STROHMEYER 3,267,429

DIGITAL TO PULSE COMPARATOR APPARATUS

Filed Sept. 16, 1963 4 Sheets-Sheet 1

INVENTOR.
GARRY G. STROHMEYER
BY Roger W. Jensen
ATTORNEY

Aug. 16, 1966 G. G. STROHMEYER 3,267,429

DIGITAL TO PULSE COMPARATOR APPARATUS

Filed Sept. 16, 1963 4 Sheets-Sheet 2

INVENTOR.
GARRY G. STROHMEYER
BY Roger W. Jensen
ATTORNEY

DIGITAL TO PULSE COMPARATOR APPARATUS

Filed Sept. 16, 1963 4 Sheets-Sheet 3

INVENTOR.
GARRY G. STROHMEYER

BY Roger W. Jensen

ATTORNEY

INVENTOR.
GARRY G. STROHMEYER
BY Roger W. Jensen
ATTORNEY

United States Patent Office 3,267,429

Patented August 16, 1966

3,267,429

DIGITAL TO PULSE COMPARATOR APPARATUS

Garry G. Strohmeyer, Hacienda Heights, Calif., assignor to Honeywell Inc., a corporation of Delaware Filed Sept. 16, 1963, Ser. No. 309,113
4 Claims. (Cl. 340—146.2)

This invention pertains to improvements in control apparatus and more particularly to improvements in digital to pulse converters.

The invention comprises a memory circuit which provides output information in the form of a plurality of parallel binary digits which are fed to a first group of inputs of a first comparator circuit. A second group of inputs of the first comparator circuit are connected to a binary counter which also provides a plurality of parallel binary digits output. The counter continuously counts from zero through its maximum desired count and then recycles. When the count in the binary counter coincides with the parallel binary digit word output of the memory circuit, the comparator circuit produces an output signal.

Each time the binary counter passes through a count of zero a reference output pulse is generated. One manner in which this reference pulse can be generated is by comparing the output of the binary counter with a fixed binary zero reference signal in a second comparator. In this manner when the binary counter passes through zero count the second comparator will produce the reference output pulse. If the output signal of the first comparator is compared with the reference output signal of the second comparator the time-value between the two pulses is proportional to the value of the binary number output of the memory circuit.

The binary counter generates a multiple-bit parallel output pattern ranging from binary xero through a maximum counter range. The maximum range of the counter is determined by the maximum expected binary output of the memory circuit. The binary counter stages are triggered simultaneously by an external clock signal so as to prevent any switching delay between the least and most significant binary stages. In the present invention such delays would result in ambiguous output information.

The comparator portion of the invention must compare the plurality of outputs of the binary counter with the plurality of outputs from the memory and determine when these outputs are simultaneously coincident. The logical equation for the simultaneous coincidence of a plurality of inputs is:

$$(1)\quad X=(B_1\cdot C_1+\overline{B}_1\cdot\overline{C}_1)(B_2\cdot C_2+\overline{B}_2\cdot\overline{C}_2)\ \ldots\ (B_n\cdot C_n+\overline{B}_n\cdot\overline{C}_n)$$

If we let the letter B represent the output signal from the memory while the letter C represents the output signal from the binary counter, it can be seen that in order to determine the simultaneous coincidence of the two output signals it is necessary to have both the normal outputs and also the complementary outputs from both the memory circuit and from the binary counter. If we assume that the binary output of the memory and the binary output of the counter are each 12-bit numbers then we can see that it would require 48 inputs to the comparator circuit in order to determine the simultaneous coincidence of the two numbers.

However, if the logic of the comparator circuit is mechanized to satisfy the equation:

$$(2)\quad \overline{\overline{X=(B_1+\overline{C}_1)(B_2+\overline{C}_2)\ \ldots\ (B_n+\overline{C}_n)}}$$
$$\overline{+B_1\cdot\overline{C}_1+B_2\cdot\overline{C}_2+\ \ldots\ B_n\overline{C}_n}$$

it may be seen that only the normal outputs from the memory circuit and the complementary outputs from the binary counter circuits are utilized. If we again assume that the binary numbers from both the memory and the counter are 12-bit numbers, then it can be seen that only a total of 24 inputs are required to the comparator circuit.

It is one object of this invention, therefore, to provide an improved digital to pulse converter circuit.

Another object of this invention is to provide a digital to pulse converter wherein the time between two generated pulses is indicative of the value of a binary input.

A further object of this invention is to provide a digital to pulse converter which has a simplified logic mechanization.

These and other objects of my invention will become apparent to those skilled in the art upon consideration of the accompanying specification, claims, and drawings, of which:

STRUCTURE OF FIGURE 1

Figure 1:
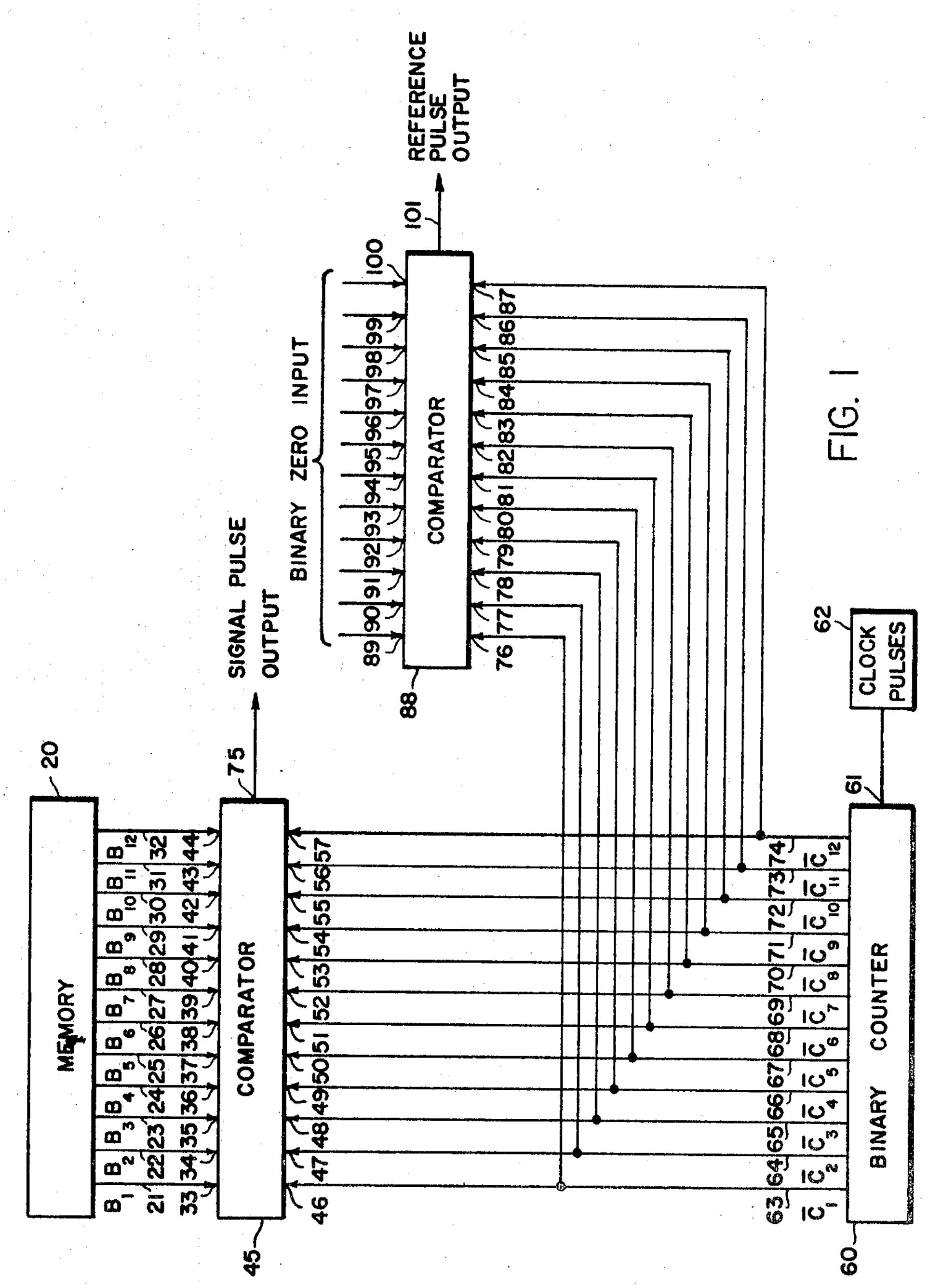
FIGURE 1 is a block diagram representation of an embodiment of this invention.

Referring to FIGURE 1 there is shown a memory unit 20 having a plurality of outputs 21–32 which are respectively connected to a plurality of inputs 33–44 of a comparator 45. Comparator 45 further has a plurality of inputs 46–57.

A binary counter 60 has an input 61 which is connected to the output of a source of clock pulses 62. Binary counter 60 further has a plurality of outputs 63–74 which are respectively connected to inputs 46–57 of comparator 45. Comparator 45 further has a signal pulse output line 75.

Outputs 63–74 of binary counter 60 are further connected to a plurality of inputs 76–87 of a comparator 88. Comparator 88 further has a plurality of inputs 89–100, which are connected to a fixed binary zero input number, and a reference pulse output line 101.

OPERATION OF FIGURE 1

Memory unit 20 represents any device capable of producing a parallel binary output representative of a given condition. For example, assume that memory unit 20 produces a 12-bit parallel output representative of angular position. This binary output is represented by the digits $B_1$ through $B_{12}$, $B_1$ being the lowest order bit and $B_{12}$ being the highest order bit. If it is assumed that the binary output signal of memory unit 20 is representative of angular position in degrees and tenths of degrees then the binary number output of memory 20 will vary from 0000 0000 0000, representative of zero degrees angular position to binary 1110 0000 1111, representative of 359.9 degrees. This binary number is coupled to the inputs 33–44 of comparator circuit 45.

Clock pulse source 62 is connected to the input 61 of binary counter 60 and each clock pulse causes counter 60 to increment by one count. Since the maximum binary number from the output of memory 20 is equal to 3599 or binary 1110 0000 1111, it is necessary that the binary circuit 60 recycle after count 3599. It is evident that if the counter does not recycle after count 3599 the maximum count the counter would attain would be 4098, or binary 1111 1111 1111. The twelve flip-flops which comprise the binary counter are triggered simultaneously by the clock pulses from clock source 62. This prevents any switching delays between the least and most significant flip-flops.

The stages generating outputs 63–74 of binary counter 60 are connected to their respective flip-flop stages of counter 60 so that the binary counter complement output appears on outputs 63–74. The binary counter output is represented by $\overline{C}_1$ through $\overline{C}_{12}$.

The complementary outputs $\overline{C}_1$ through $\overline{C}_{12}$ of binary counter 60 are coupled to inputs 46–57 of comparator 45. When each bit of the memory output is simultaneously coincident with each bit of the binary counter 60, the comparator 45 will produce an output pulse on the signal pulse output line 75.

The complementary output of binary counter 60 is further connected through inputs 76–87 of comparator 88. Inputs 89–100 of comparator 88 are connected to a fixed binary zero input. Therefore, when binary counter 60 registers a count of zero, that is a binary number 0000 0000 0000, comparator 88 will produce an output pulse on the reference pulse output line 101. The time between the occurrence of the reference pulse on line 101 and the signal pulse on line 75 is directly proportional to the magnitude of the binary number output from the memory unit 20.

STRUCTURE OF FIGURES 2 AND 3

Figure 2:
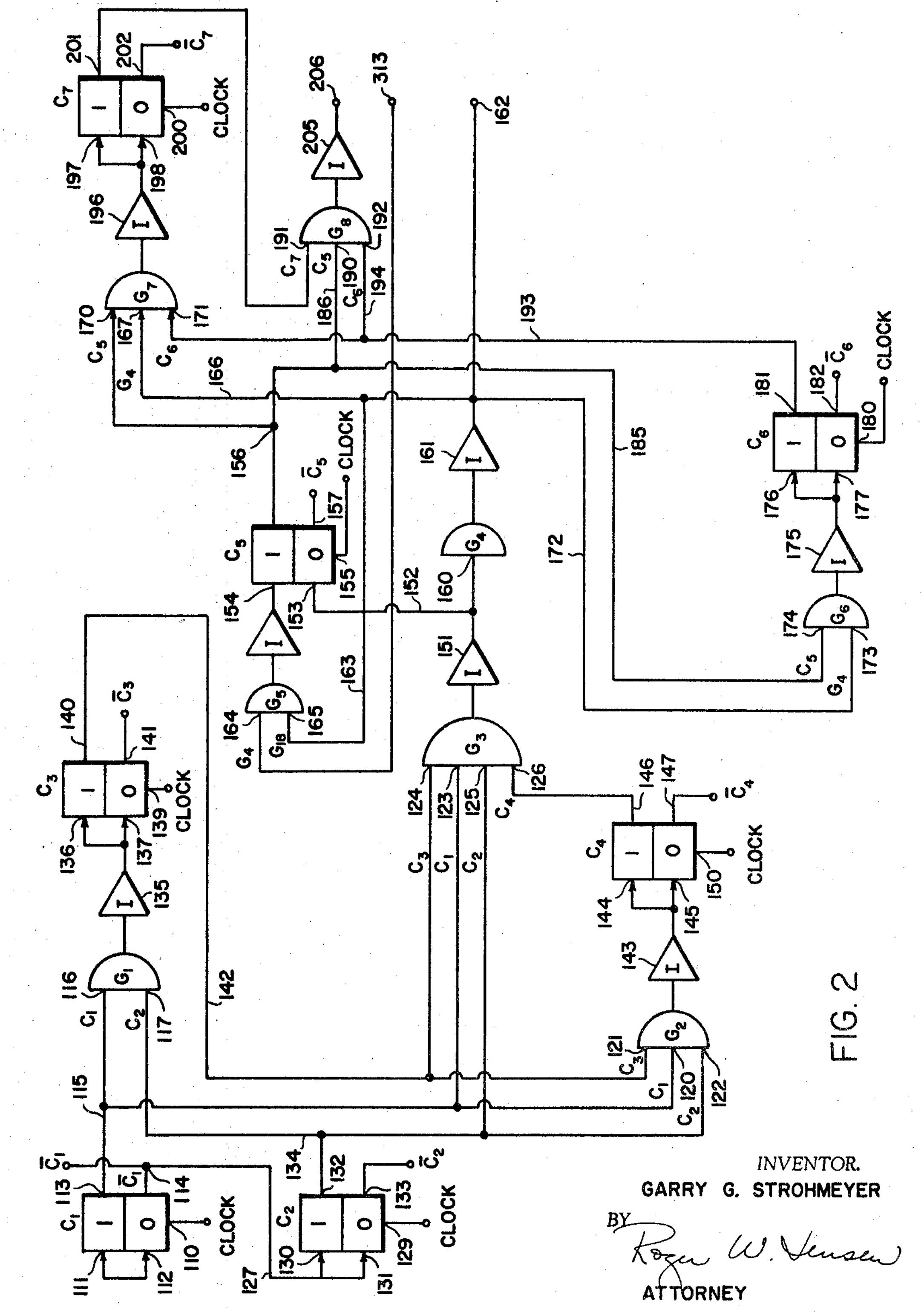
FIGURES 2 and 3 are a schematic representation of a binary counter used in this invention.
Figure 3:
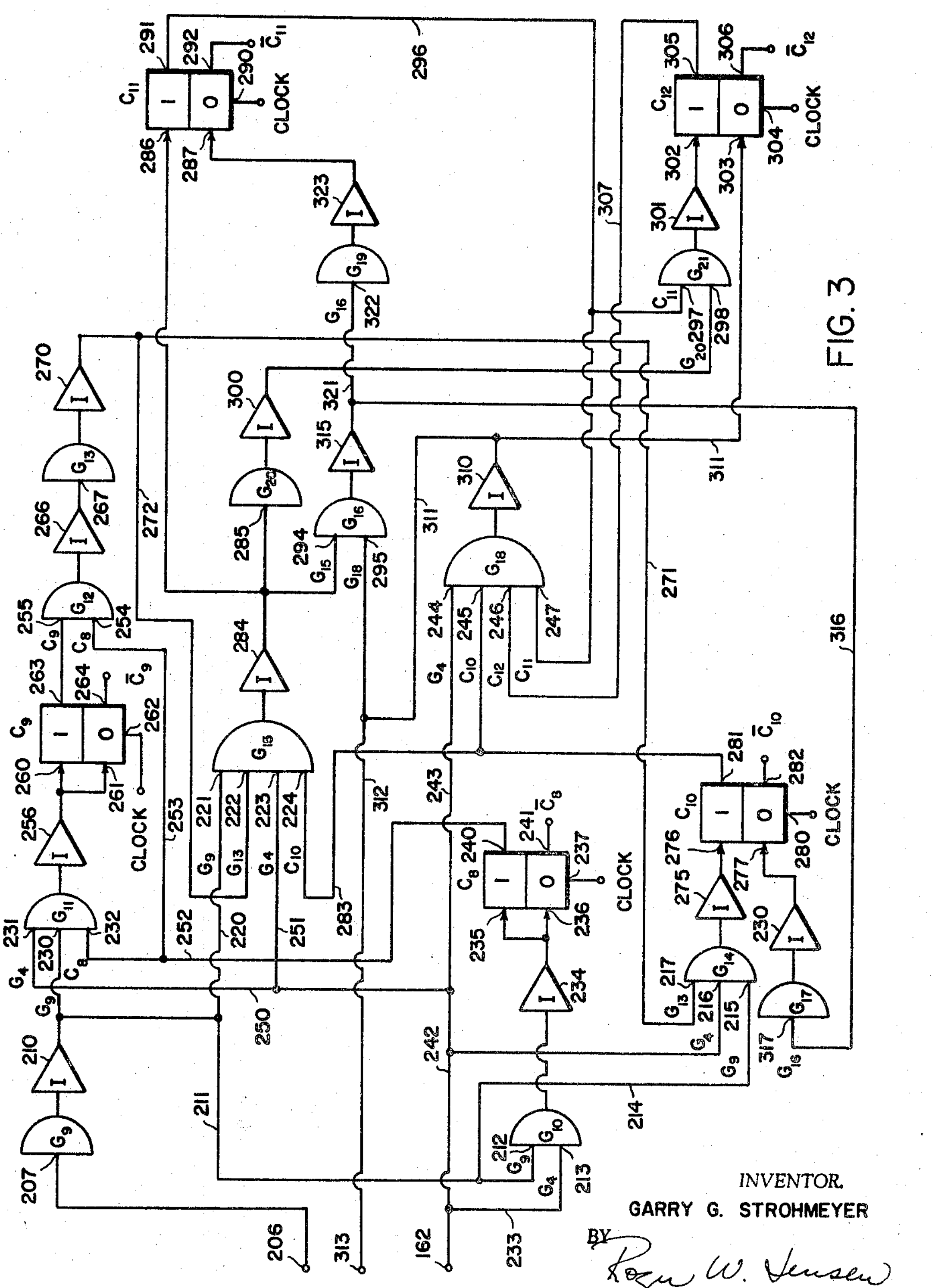

FIGURES 2 and 3 show a schematic representation of the binary counter 60. Counter 60 comprises twelve flip-flops, flip-flops $C_1$ through $C_7$ being shown on FIGURE 2 and flip-flops $C_8$ through $C_{12}$ being shown on FIGURE 3. The flip-flops used in counter 60 are clock triggered J–K type with inhibit type 1-set and 0-set inputs. A description of J–K type flip-flops can be found in Logic Design of Digital Computers, Montgomery Phister, John Wiley & Sons, 1958.

Referring to FIGURE 2 there is shown a $C_1$ flip-flop having a clock input 110, a set 1 input 111, a set 0 input 112, a $C_1$ output 113, and a $\overline{C}_1$ output 114. The $C_1$ output 113 of flip-flop $C_1$ is connected by means of a conductor 115 to an input 116 of a gate $G_1$, to an input 120 of a gate $G_2$, and to an input 23 of a gate $G_3$. Gate $G_1$ further has an input 117, gate $G_2$ further has inputs 121 and 122, and gate $G_3$ further has inputs 124, 125 and 126. The $\overline{C}_1$ output 114 of flip-flop $C_1$ is connected by means of a conductor 127 to a set 1 input 130 and a set 0 input 131 of flip-flop $C_2$. Flip-flop $C_2$ further has a clock input 129, a $C_2$ output 132 and a $\overline{C}_2$ output 133. Output 132 of flip-flop $C_2$ is connected by means of a conductor 134 to the input 117 of gate $G_1$, to the input 125 of gate $G_3$, and to the input 122 of gate $G_2$. The output of gate $G_1$ is connected through an inverter 135 to a set 1 input 136 and a set 0 input 137 of flip-flop $C_3$. Flip-flop $C_3$ further has a clock input 139, a $C_3$ output 140 and a $\overline{C}_3$ output 141. Output 140 of flip-flop $C_3$ is connected by means of a conductor 142 to the input 121 of gate $G_2$ and to the input 124 of gate $G_3$. The output of gate $G_2$ is connected through an inverter amplifier 143 to a set 1 input 144 and a set 0 input 145 of flip-flop $C_4$. Flip-flop $C_4$ further has a $C_4$ output 146 and a $\overline{C}_4$ output 147 as well as a clock input 150. The output 146 of flip-flop $C_4$ is connected to the input 126 of gate $G_3$. The output of gate $G_3$ is connected through an inverting amplifier 151 and a conductor 152 to a set 0 input 153 of flip-flop $C_5$. Flip-flop $C_5$ further has a set 1 input 154, a clock input 155, a $C_5$ output 156, and a $\overline{C}_5$ output 157. The output of inverting amplifier 151 is further connected to an input 160 of gate $G_4$. The output of gate $G_4$ is connected through an inverting amplifier 161 to a terminal 162. The output of inverting amplifier 161 is further connected by means of a conductor 163 to an input 165 of an AND gate $G_5$. AND gate $G_5$ further has an input 164 and an output connected through an inverting amplifier to input 154 of flip-flop $C_5$. The output of inverting amplifier 161 is further connected by means of a conductor 166 to an input 167 of an AND gate $G_7$ and by means of a conductor 172 to an input 173 of an AND gate $G_6$. AND gate $G_7$ further has an input 170 and an input 171, while AND gate $G_6$ further has an input 174.

The output of AND gate $G_6$ is connected through an inverting amplifier 175 to a set 1 input 176 and a set 0 input 177 of flip-flop $C_6$. Flip-flop $C_6$ further has a clock input 180, a $C_6$ output 181 and a $\overline{C}_6$ output 182. Output 156 of flip-flop $C_5$ is connected to input 170 of AND gate $G_7$, and by means of a conductor 185 to the input 174 of AND gate $G_6$. Output 156 of flip-flop $C_5$ is further connected by means of a conductor 186 to an input 190 of an AND gate $G_8$. AND gate $G_8$ further has an input 191 and an input 192. The output 181 of flip-flop $C_6$ is connected by means of a conductor 193 to input 171 of AND gate $G_7$, and by means of conductor 193 and a conductor 194 to the input 192 of AND gate $G_8$. The output of AND gate $G_7$ is connected through an inverting amplifier 196 to a set 1 input 197 and a set 0 input 198 of flip-flop $C_7$. Flip-flop $C_7$ further has a clock input 200, a $C_7$ output 201 and a $\overline{C}_7$ output 202. Output 201 of flip-flop $C_7$ is connected to input 191 of AND gate $C_8$.

The output of AND gate $G_8$ is connected through an inverting amplifier 205 to an output terminal 206.

Output terminal 206 (see FIGURE 3) is connected to an input 207 of AND gate $G_9$. The output of gate $G_9$ is connected through an inverting amplifier 210 and a conductor 211 to an input 212 of an AND gate $G_{10}$, through conductor 211 and a conductor 214 to an input 215 of an AND gate $G_{14}$, through conductor 211 and a conductor 220 to an input 221 of an AND gate $G_{15}$, AND gate $G_{10}$ further has an input 213, AND gate $G_{14}$ further has an input 216, and an input 217, AND gate $G_{15}$ further has an input 222, and input 223, and an input 224.

The output of inverting amplifier 210 is further connected to an input 230 of an AND gate $G_{11}$ AND gate $G_{11}$ further has an input 231 and an input 232.

Terminal 162, which is connected to the output of inverting amplifier 161 of FIGURE 2, is connected by means of a conductor 233 to the input 213 of AND gate $G_{10}$. The output of AND gate $G_{10}$ is connected through an inverting amplifier 234 to a set 1 input 235 and a set 0 input 236 of flip-flop $C_8$. Flip-flop $C_8$ further has a clock input 237, a $C_8$ output 240, and a $\overline{C}_8$ output 241.

Terminal 162 is further connected by means of a conductor 242 to the input 216 of AND gate $G_{14}$, by means of conductor 242 and a conductor 243 to an input 244 of an AND gate $G_{18}$, by means of conductor 242 and a conductor 250 to the input 231 of AND gate $G_{11}$, and by means of conductors 242, 250, and 251 to the input 223 of AND gate $G_{15}$.

AND gate $G_{18}$ further has inputs 245, 246 and 247.

Output 240 of flip-flop $C_8$ is connected by means of a conductor 252 to the input 232 of AND gate $G_{11}$, and by means of conductor 252 and conductor 253 to an input 254 of AND gate $G_{12}$. AND gate $G_{12}$ further has an input 255.

The output of AND gate $G_{11}$ is connected through an inverting amplifier 256 to a set 1 input 260 and a set 0 input 261 of flip-flop $C_9$. Flip-flop $C_9$ further has a clock input 262, a $C_9$ output 263 and a $\overline{C}_9$ output 264. The output 263 of flip-flop $C_9$ is connected to the input 255 of AND gate $G_{12}$.

The output of AND gate $G_{12}$ is connected through an inverting amplifier 266 to an input 267 of gate $G_{13}$. The output of gate $G_{13}$ is connected through an inverting amplifier 270 and a conductor 271 to the input 217 of AND gate $G_{14}$. The output of inverting amplifier 270 is further connected by means of a conductor 272 to the input 222 of AND gate $G_{15}$.

The output of AND gate $G_{14}$ is connected through an inverting amplifier 275 to a set 1 input 276 of flip-flop $C_{10}$. Flip-flop $C_{10}$ further has a set 0 input 277, a clock input 280, a $C_{10}$ output 281, and a $\overline{C}_{10}$ output 282. Output 281 of flip-flop $C_{10}$ is connected by means of a conductor 283 to input 245 of AND gate $G_{18}$ and to input 224 of AND gate $G_{15}$.

The output of AND gate $G_{15}$ is connected through an inverting amplifier 284 to an input 285 of gate $G_{20}$, to a set 1 input 286 of flip-flop $C_{11}$, and to an input 294 of an AND gate $G_{16}$. Flip-flop $C_{11}$ further has a set 0 input 287, a clock input 290, a $C_{11}$ output 291, and a $\overline{C}_{11}$ output 292, while AND gate $G_{16}$ further has an input 295.

The output 291 of flip-flop $C_{11}$ is connected by means of a conductor 296 to the input 247 of AND gate $G_{18}$, and to an input 297 of an AND gate $G_{21}$. AND gate $G_{21}$ further has an input 298. The output of gate $G_{20}$ is connected through inverting amplifier 300 to the input 298 of AND gate $G_{21}$. The output of AND gate $G_{21}$ is connected through an inverting amplifier 301 to a set 1 input 302 of flip-flop $C_{12}$. Flip-flop $C_{12}$ further has a set 0 input 303, a clock input 304, a $C_{12}$ output 305, and a $\overline{C}_{12}$ output 306. Output 305 of flip-flop $C_{12}$ is connected by means of a conductor 307 to the input 246 of AND gate $G_{18}$.

The output of AND gate $G_{18}$ is connected to the input of an inverting amplifier 310. The output of inverting amplifier 310 is connected by means of a conductor 311 to the input 295 of AND gate $G_{16}$ and to input 303 of flip-flop $C_{12}$, and by means of conductor 311 and a conductor 312 to a terminal 313. Terminal 313 (see FIGURE 2) is connected by means of a conductor to the input 164 of AND gate $G_5$.

The output of AND gate $G_{16}$ is connected through an inverting amplifier 315 and a conductor 316 to an input 317 of gate $G_{17}$. The output of gate $G_{17}$ is connected through an inverting amplifier 320 to the set 0 input 277 of flip-flop $C_{10}$. The output of inverting amplifier 315 is further connected by means of a conductor 321 to an input 322 of gate $G_{19}$. The output of gate $G_{19}$ is connected through an inverting amplifier 323 to the set 0 input 287 of flip-flop $C_{11}$

OPERATION OF FIGURES 2 AND 3

As mentioned previously, each time a count is registered in counter 60, each of the twelve flip-flops, $C_1$ through $C_{12}$, are triggered simultaneously by the clock signal Since each of the flip-flops are triggered by the clock signal it is necessary to provide inhibit logic to the various set 1 and set 0 inputs of the flip-flops so that only the correct flip-flops change state. The counter circuit shown in FIGURES 2 and 3 is designed to provide a count from zero to 3599, or in binary notation from 0000 0000 0000 to 1110 0000 1111. It is necessary to recycle the counter 60 after the count reaches 1110 0000 1111 since in the illustration assume the converter is converting from a binary representation of angular position to a pulse representative of angular position, the angular data being expressed in degrees and tenths of degrees. The logic output equations for each of the gates $G_1$ through $G_{21}$ are set forth below in Equations 3 through 23. In these equations the output is considered from the output of the gate and its associated inverting amplifier. For example, the output of gate $G_1$ would be from the output of inverting amplifier 135.

(3) $G_1=\overline{C_1\cdot C_2}$ (4) $G_2=\overline{C_1\cdot C_2\cdot C_3}$ (5) $G_3=\overline{C_1\cdot C_2\cdot C_3\cdot C_4}$ (6) $G_4=\overline{G}_3=C_1\cdot C_2\cdot C_3\cdot C_4$ (7) $G_5=\overline{G_4\cdot G_{18}}=\overline{C_1\cdot C_2\cdot C_3\cdot C_4\cdot C_{10}\cdot C_{11}\cdot C_{12}}$ (8) $G_6=\overline{G_4\cdot C_5}=\overline{C_1\cdot C_2\cdot C_3\cdot C_4\cdot C_5}$ (9) $G_7=\overline{G_4\cdot C_5\cdot C_6}=\overline{C_1\cdot C_2\cdot C_3\cdot C_4\cdot C_5\cdot C_6}$

(10) $G_8=\overline{C_5\cdot C_6\cdot C_7}$

(11) $G_9=\overline{G}_8=C_5\cdot C_6\cdot C_7$

(12) $G_{10}=\overline{G_4\cdot G_9}=\overline{C_1\cdot C_2\cdot C_3\cdot C_4\cdot C_5\cdot C_6\cdot C_7}$

(13) $G_{11}=\overline{G_4\cdot G_9\cdot C_8}=\overline{C_1\cdot C_2\cdot C_3\cdot C_4\cdot C_5\cdot C_6\cdot C_7\cdot C_8}$

(14) $G_{12}=\overline{C_8\cdot C_9}$

(15) $G_{13}=\overline{G}_{12}=C_8\cdot C_9$

(16) $G_{14}=\overline{G_4\cdot G_9\cdot G_{13}}=\overline{C_1\cdot C_2\cdot C_3\cdot C_4\cdot C_5\cdot C_6\cdot C_7\cdot C_8\cdot C_9}$

(17) $G_{15}=\overline{G_4\cdot G_9\cdot G_{13}\cdot C_{10}}=\overline{C_1}\cdot \overline{C_2\cdot C_3\cdot C_4\cdot C_5\cdot C_6\cdot C_7\cdot C_8\cdot C_9\cdot C_{10}}$

(18) $G_{16}=\overline{G_{15}\cdot G_{18}}=C_1\cdot C_2\cdot C_3\cdot C_4\cdot C_5\cdot C_6\cdot C_7\cdot C_8\cdot C_9\cdot C_{10}+C_1\cdot C_2\cdot C_3\cdot C_4\cdot C_{10}\cdot C_{11}\cdot C_{12}$

(19) $G_{17}=\overline{G}_{16}=\overline{C_1\cdot C_2\cdot C_3\cdot C_4\cdot C_5\cdot C_6}\,\overline{C_7\cdot C_8\cdot C_9\cdot C_{10}}+\overline{C_1\cdot C_2\cdot C_3\cdot C_4\cdot C_{10}\cdot C_{11}\cdot C_{12}}$

(20) $G_{18}=\overline{G_4\cdot C_{10}\cdot C_{11}\cdot C_{12}}=\overline{C_1\cdot C_2\cdot C_3\cdot C_4\cdot C_{10}\cdot C_{11}\cdot C_{12}}$

(21) $G_{19}=\overline{G}_{16}=\overline{C_1\cdot C_2\cdot C_3\cdot C_4\cdot C_5\cdot C_6\cdot C_7}\cdot \overline{C_8\cdot C_9\cdot C_{10}}+\overline{C_1\cdot C_2\cdot C_3\cdot C_4\cdot C_{10}\cdot C_{11}\cdot C_{12}}$

(22) $G_{20}=\overline{G}_{15}=C_1\cdot C_2\cdot C_3\cdot C_4\cdot C_5\cdot C_6\cdot C_7\cdot C_8\cdot C_9\cdot C_{10}$

(23) $G_{21}=\overline{G_{20}C_{11}}=\overline{C_1\cdot C_2\cdot C_3\cdot C_4}\cdot \overline{C_5\cdot C_6\cdot C_7\cdot C_8\cdot C_9\cdot C_{10}\cdot C_{11}}$ As can be seen from FIGURES 2 and 3, the triggering of the various flip-flops of the counter is determined by the output of the selected gate circuits. For example, the output of gate circuit $G_1$ determines the triggering of flip-flop $C_3$ while the output of gate $G_7$ determines the triggering of flip-flop $C_7$. As can be seen from the drawings, flip-flops $C_1$, $C_2$, $C_3$, $C_4$, $C_6$, $C_7$, $C_8$, and $C_9$ have set 1 and set 0 inputs connected in common, while flip-flops $C_5$, $C_{10}$, $C_{11}$, and $C_{12}$, each have their set 1 and set 0 inputs connected to individual gates. For examples, the set 1 input of flip-flop $C_5$ is connected to the output of gate $G_5$ while the set 0 input of flip-flops $C_5$ is connected to the output of gate $G_3$. The logic equations for each of the flip-flops of counter 60 are set forth below, with the separate set 0 and set 1 equations of flip-flops $C_5$, $C_{10}$, $C_{11}$ and $C_{12}$ also being indicated.

(24) $C_1=P$

(25) $\overline{C}_2=C_1\cdot P$

(26) $C_3=G_1\cdot P=\overline{C_1\cdot C_2}\cdot P$

(27) $C_4=G_2\cdot P=\overline{C_1\cdot C_2\cdot C_3}\cdot P$

(28) $C_5(\text{set } 0)=G_3\cdot P=\overline{C_1\cdot C_2\cdot C_3\cdot C_4}\cdot P$

(29) $C_5(\text{set } 1)=G_5\cdot P=\overline{C_1\cdot C_2\cdot C_3\cdot C_4\cdot \overline{C_{10}\cdot C_{11}\cdot C_{12}}}\cdot P$

(30) $C_6=G_6\cdot P=\overline{C_1\cdot C_2\cdot C_3\cdot C_4\cdot C_5}\cdot P$

(31) $C_7=G_7\cdot P=\overline{C_1\cdot C_2\cdot C_3\cdot C_4\cdot C_5\cdot C_6}\cdot P$

(32) $C_8=G_{10}\cdot P=\overline{C_1\cdot C_2\cdot C_3\cdot C_4\cdot C_5\cdot C_6\cdot C_7}\cdot P$

(33) $C_9=G_{11}\cdot P=\overline{C_1\cdot C_2\cdot C_3\cdot C_4\cdot C_5\cdot C_6\cdot C_7\cdot C_8}\cdot P$

(34) $C_{10}(\text{set } 0)=G_{17}\cdot P=\overline{C_1\cdot C_2\cdot C_3\cdot C_4\cdot C_6\cdot C_7}\cdot \overline{C_8\cdot C_9\cdot C_{10}}+\overline{C_1\cdot C_2\cdot C_3\cdot C_4\cdot C_{10}\cdot C_{11}\cdot C_{12}}\cdot P$

(35) $C_{10}(\text{set } 1)=G_{14}\cdot P=\overline{C_1\cdot C_2\cdot C_3}\cdot \overline{C_4\cdot C_5\cdot C_6\cdot C_7\cdot C_8\cdot C_9}\cdot P$

(36) $C_{11}(\text{set } 0)=G_{19}\cdot P=\overline{C_1\cdot C_2\cdot C_3\cdot C_4\cdot C_5\cdot C_6}\cdot \overline{C_7\cdot C_8\cdot C_9\cdot C_{10}}+\overline{C_1\cdot C_2\cdot C_3\cdot C_4\cdot C_{10}\cdot C_{11}\cdot C_{12}}\cdot P$

(37) $C_{11}(\text{set } 1)=G_{15}\cdot P=\overline{C_1\cdot C_2}\cdot \overline{C_3\cdot C_4\cdot C_5\cdot C_6\cdot C_7\cdot C_8\cdot C_9\cdot C_{10}}\cdot P$

(38) $C_{12}(\text{set } 0)=G_{18}\cdot P=\overline{C_1\cdot C_2\cdot C_3\cdot C_4\cdot C_{10}\cdot C_{11}\cdot C_{12}}\cdot P$

(39) $C_{12}(\text{set } 1)=G_{21}\cdot P=\overline{C_1\cdot C_2\cdot C_3\cdot C_4\cdot C_5}\cdot \overline{C_6\cdot C_7\cdot C_8\cdot C_9\cdot C_{10}\cdot C_{11}}\cdot P$

STRUCTURE OF FIGURE 4

Figure 4:
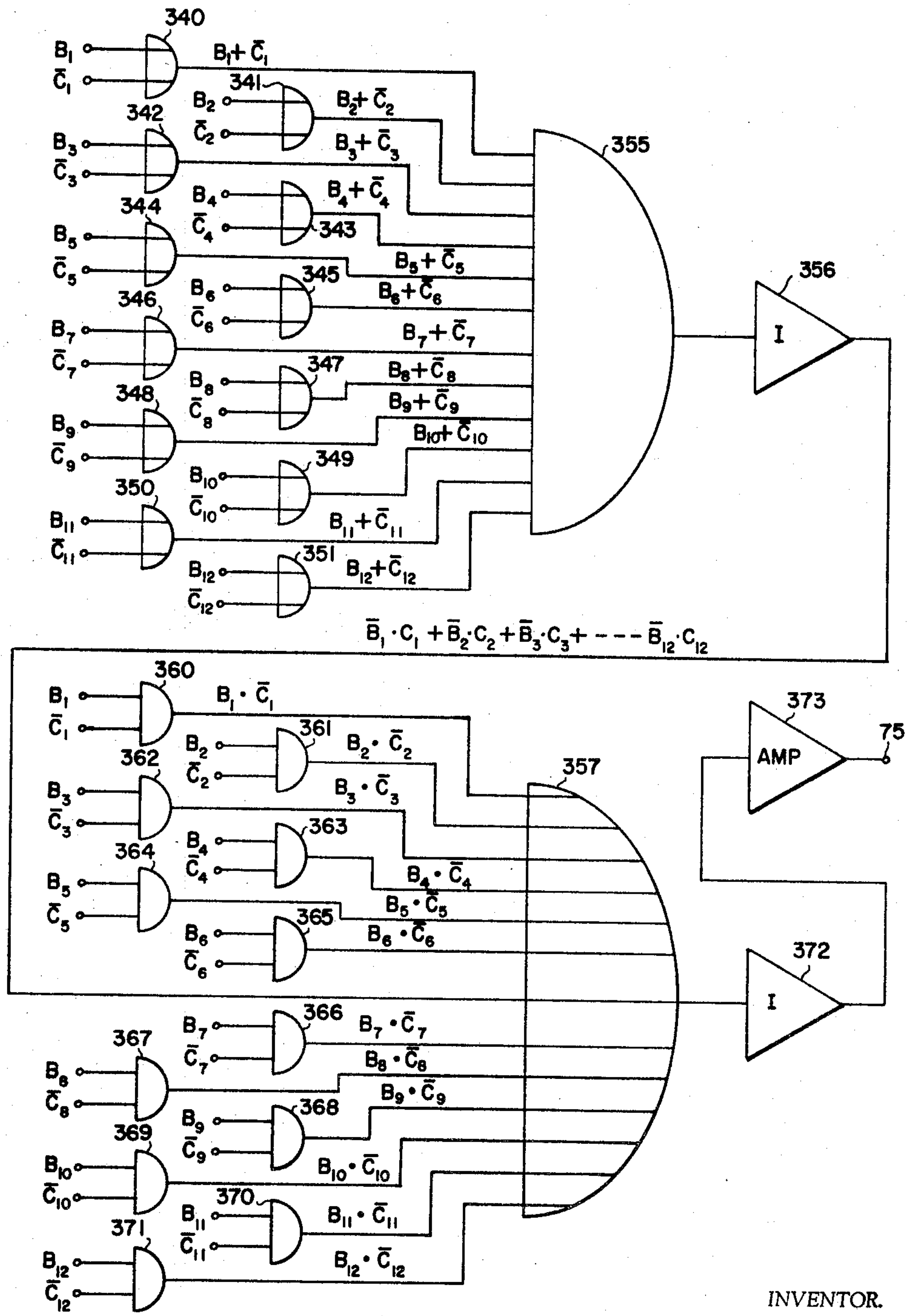
FIGURE 4 is a schematic representation of a comparator circuit used in this invention.

Referring to FIGURE 4 there is shown a plurality of OR gates 340–351, each having first and second inputs and an output. One input from each of the OR gates 340–351 is connected to a separate bit output of the binary number $B_1$ through $B_{12}$ from the output of the memory unit 20, while the other input of each of the OR gates is connected to a separate bit of the output number $\overline{C}_1$ through $\overline{C}_{12}$ from the output of binary counter 60.

Each output of the OR gates 340–351 is connected to a separate input of an AND gate 355. The output of AND gate 355 is connected through an inverting amplifier 356 to an input of an OR gate 357.

A plurality of AND gates 360–371 each have a first and second input and an output. One input from each of the AND gates 360–371 is connected to a separate bit of the output number $B_1$ through $B_{12}$ from the output of memory 20 while the other input of each of the AND gates 360–371 is connected to a separate bit of the output number $\overline{C}_1$ through $\overline{C}_{12}$ from the output of binary counter 60. The outputs of AND gates 360–371 are each connected to separate inputs of OR gate 357. The output of OR gate 357 is connected through an inverting amplifier 372 and an amplifier 373 to the output signal terminal 75.

OPERATION OF FIGURE 4

As can be seen by referring to Equation 2, the equation for a comparator for comparing 12-bit binary input numbers is as follows:

(40) $$X=\overline{(B_1+\overline{C}_1)(B_2+\overline{C}_2)\ldots(B_{12}+\overline{C}_{12})+B_1\cdot\overline{C}_1+B_2\cdot\overline{C}_2\ldots B_{12}\cdot\overline{C}_{12}}$$

In the comparator shown in FIGURE 4 each corresponding bit of the binary number $B_1$ through $B_{12}$ from the output of memory 20 and the binary number $\overline{C}_1$ through $\overline{C}_{12}$ from the output of binary counter 60 are OR'd together in OR gates 340–351. For example, the output of OR gate 340 will be

(41) $$B_1+\overline{C}_1$$

The output of OR gate 341 will be

(42) $$B_2+\overline{C}_2, \ldots$$

and the output of OR gate 351 will be

(43) $$B_{12}+\overline{C}_{12}$$

The outputs from OR gates 340–351 are ANDed together in AND gate 355 and are inverted by inverter 356 so that the output of inverter 356 is

(44) $$\overline{B}_1\cdot C_1+\overline{B}_2\cdot C_2+\overline{B}_3\cdot C_3\ldots\overline{B}_{12}\cdot C_{12}$$

Each corresponding bit of the binary number $B_1$ through $B_{12}$ from the output of memory 20 and the binary number $\overline{C}_1$ through $\overline{C}_{12}$ form the output of binary counter 60 and are ANDed together in AND circuits 360–371 so that the output of AND gate 360 is

(45) $$B_1\cdot\overline{C}_1$$

The output of AND gate 361 is

(46) $$B_2\cdot\overline{C}_2$$

The output of AND gate 362 is

(47) $$B_3\cdot\overline{C}_3$$

The output of AND gates 360–371 and the output from inverting amplifier 356 are OR'd together in OR gate 357. The output of OR gate 357 is inverted in inverting amplifier 372 and is amplified in amplifier 373 and appears at output signal terminal 374. A pulse will appear at output terminal 75 when the binary number from the memory unit 20 and the binary number in the binary counter 60 are simultaneously coincident.

In order to generate the reference pulse output from the comparator 88 shown in FIGURE 1, a comparator which is structurally the same as that shown in FIGURE 4 could be used, the only difference being that instead of the binary number $B_1$ through $B_{12}$ being fed to the OR gate and AND gate input terminals the binary number 0 would be fed to these terminals instead. In this manner when the binary counter 60 recycled through 0, comparator 88 would produce a reference pulse output at the output signal terminal.

It is to be understood that while I have shown a specific embodiment of my invention that this is for the purpose of illustration only and that my invention is to be limited solely by the scope of the appended claims.

I claim:

1. Digital comparing apparatus comprising:
a memory circuit having a binary number output $B_1, B_2 \ldots B_n$ where the subscripts indicate the order of the binary number bit;
a binary counter having a complement output $\overline{C}_1, \overline{C}_2 \ldots \overline{C}_n$;
means for OR'ing like order bits of the memory circuit output and the counter circuit output to produce first signals $B_1+\overline{C}_1, B_2+\overline{C}_2 \ldots B_n+\overline{C}_n$;
means for AND'ing and inverting the first signals to produce a second signal $\overline{B}_1\cdot C_1+\overline{B}_2\cdot C_2 \ldots \overline{B}_n\cdot C_n$;
means for AND'ing like order bits of the memory circuit output and the counter circuit output to produce third signals $B_1\cdot\overline{C}_1, B_2\cdot\overline{C}_2 \ldots B_n\cdot\overline{C}_n$; and
means for OR'ing and inverting said second signal and said third signals to produce an output signal indicative of correspondence between the binary number output of said memory circuit and a count in said binary counter.

2. Digital comparing apparatus comprising:
a memory circuit having a parallel binary number output;
a binary counter having a plurality of stages equal to the number of bits in the parallel binary number output of said memory circuit, each of the counter stages providing a complement output;
a plurality of first OR gates having inputs and outputs;
means respectively connecting each bit of the binary number output of said memory circuit and the respective order complement bit output of said binary counter to the inputs of a separate one of said plurality of first OR gates;
a first AND gate having a plurality of inputs and an output;
means connecting the outputs of said plurality of first OR gates to the plurality of inputs of said first AND gate;
means connecting the output of said first AND gate to a first inverter;
a plurality of second AND gates having inputs and outputs;
means respectively connecting each bit of the binary number output of said memory circuit and the respective order complement bit output of said binary counter to the inputs of a separate of said plurality of second AND gates;
a second OR gate having a plurality of inputs and an output;
means connecting the outputs of said plurality of second AND gates and the output of said first inverter to the plurality of inputs of said second OR gate; and
means connecting the output of said second OR gates through an inverter to an output.

3. Digital comparing apparatus comprising:
a memory circuit having a binary number output $B_1, B_2 \ldots B_n$, where the subscripts indicate the order of the binary number bit;
a binary counter having a complement output $\overline{C}_1, \overline{C}_2 \ldots \overline{C}_n$;
means connected to the complement output of said binary counter to produce a reference pulse each time the count in said counter is at a predetermined value;
means for OR'ing like order bits of the memory circuit output and the counter circuit output to produce first signals $B_1+\overline{C}_1, B_2+\overline{C}_2 \ldots B_n+\overline{C}_n$;
means for AND'ing and inverting the first signals to produce a second signal $\overline{B}_1\cdot C_1+\overline{B}_2\cdot C_2 \ldots \overline{B}_n\cdot C_n$;
means for AND'ing like order bits of the memory circuit output and the counter circuit output to produce third signals $B_1 \cdot \overline{C}_1, B_2 \cdot \overline{C}_2 \ldots B_n \cdot \overline{C}_n$; and means for OR'ing and inverting said second signal and said third signals to produce an output signal indicative of correspondence between the binary number output of said memory circuit and a count in said binary counter, the time between said reference pulse and said output signal being indicative of the value of the output binary number of said memory circuit.

4. Digital comparing apparatus comprising:

a memory circuit having a binary number output $B_1, B_2 \ldots B_n$, where the subscripts indicate the order of the binary number bit;

a binary counter having a complement output $\overline{C}_1, \overline{C}_2 \ldots \overline{C}_n$;

first gating means for combining said binary number output from said memory circuit and said output from said counter to produce a first signal $\overline{B}_1 \cdot C_1 + \overline{B}_2 \cdot C_2 \ldots \overline{B}_n \cdot C_n$; and second gating means for combining said binary number output from said memory circuit and said output from said counter with said first signal to produce a second signal indicative of AND'ed combinations of like ordered bits of the memory circuit output and the counter output being OR'ed with said first signal, said second signal being indicative of the equality of the memory circuit output and the counter output.

References Cited by the Examiner

UNITED STATES PATENTS

| | | | |
|---|---|---|---|
| 3,092,808 | 6/1963 | Wychorski et al. | 340—146.2 |
| 3,130,297 | 4/1964 | Venn et al. | 235—92 |

MALCOLM A. MORRISON, *Primary Examiner*.

M. J. SPIVAK, *Assistant Examiner*.